United States Patent
Kang

(10) Patent No.: US 12,298,354 B2
(45) Date of Patent: *May 13, 2025

(54) METHOD FOR PREDICTION OF BATTERY LIFE AND APPARATUS FOR PERFORMING THE METHOD

(71) Applicant: aiZEN Global Co., Inc., Seoul (KR)

(72) Inventor: Jung Seok Kang, Seoul (KR)

(73) Assignee: AIZEN GLOBAL CO., INC. (KR)

( * ) Notice: Subject to any disclaimer, the term of this patent is extended or adjusted under 35 U.S.C. 154(b) by 105 days.

This patent is subject to a terminal disclaimer.

(21) Appl. No.: 18/050,543

(22) Filed: Oct. 28, 2022

(65) Prior Publication Data

US 2023/0152387 A1 May 18, 2023

(30) Foreign Application Priority Data

Nov. 1, 2021 (KR) .......................... 10-2021-0148062

(51) Int. Cl.
*G01R 31/392* (2019.01)
*G01R 31/387* (2019.01)
(Continued)

(52) U.S. Cl.
CPC .......... *G01R 31/392* (2019.01); *G01R 31/387* (2019.01); *G01R 31/389* (2019.01); *H01M 10/48* (2013.01); *H01M 2010/4278* (2013.01)

(58) Field of Classification Search
CPC ......... B60L 2240/545; B60L 2240/662; B60L 2240/70; B60L 3/12; B60L 58/16; G01R 31/007; G01R 31/367; G01R 31/387; G01R 31/389; G01R 31/392; H01M 10/42; H01M 10/48; H01M 2010/4278
See application file for complete search history.

(56) References Cited

U.S. PATENT DOCUMENTS

| 5,596,260 A | * | 1/1997 | Moravec ............... G01R 31/367 |
|---|---|---|---|
| | | | 324/426 |
| 10,641,836 B1 | * | 5/2020 | Hou ..................... G01R 31/392 |

(Continued)

FOREIGN PATENT DOCUMENTS

| EP | 3770621 A1 * | 1/2021 | ........... G01R 31/392 |
|---|---|---|---|
| JP | 2014059227 A | 4/2014 | |

(Continued)

OTHER PUBLICATIONS

International Search Report from PCT/KR2022/016481 dated Feb. 6, 2023.

*Primary Examiner* — Babar Sarwar

(74) *Attorney, Agent, or Firm* — Mark T. Vogelbacker; Eckert Seamans Cherin & Mellott, LLC

(57) ABSTRACT

A method of predicting battery life and an apparatus for performing the method can include collecting, by a battery information collection unit, battery information. The method can further include generating. by a first battery valuation unit, first battery value data; generating. by a second battery valuation unit, second battery value data; and determining, by a battery valuation unit, a battery value based on the first battery value data and the second battery value data. The first battery value data is a battery value determined based on a battery diagnostic test. The second battery value data is a battery value determined based on vehicle data.

7 Claims, 5 Drawing Sheets

(51) Int. Cl.
*G01R 31/389* (2019.01)
*H01M 10/42* (2006.01)
*H01M 10/48* (2006.01)

(56) References Cited

U.S. PATENT DOCUMENTS

| | | | | |
|---|---|---|---|---|
| 2013/0085696 | A1* | 4/2013 | Xu | B60L 58/16 |
| | | | | 702/63 |
| 2015/0323610 | A1* | 11/2015 | Ahn | H01M 10/486 |
| | | | | 320/152 |
| 2016/0146898 | A1* | 5/2016 | Lennevi | B60L 58/13 |
| | | | | 324/426 |
| 2016/0202323 | A1* | 7/2016 | Lee | G01R 31/392 |
| | | | | 324/433 |
| 2017/0141444 | A1* | 5/2017 | Kawahara | G01R 31/392 |
| 2021/0004879 | A1* | 1/2021 | Nakajima | G06Q 30/0283 |
| 2021/0148989 | A1* | 5/2021 | Malloy | B60L 58/16 |
| 2021/0311129 | A1* | 10/2021 | Yezerets | G01R 31/385 |
| 2022/0281345 | A1* | 9/2022 | Kim | G06Q 50/06 |

FOREIGN PATENT DOCUMENTS

| | | |
|---|---|---|
| KR | 20100019249 A | 2/2010 |
| KR | 10-2065120 B1 | 2/2020 |
| KR | 20210119329 A | 10/2021 |
| KR | 10-2412697 B1 | 6/2022 |

* cited by examiner

METHOD FOR PREDICTION OF BATTERY LIFE AND APPARATUS FOR PERFORMING THE METHOD

CROSS-REFERENCE TO RELATED APPLICATION

This application claims priority to and the benefit of Korean Patent Application No. 10-2021-0148062, filed on Nov. 1, 2021, the disclosure of which is incorporated herein by reference in its entirety.

1. FIELD OF THE INVENTION

The present invention relates to a method of predicting battery life and an apparatus for performing the method. More particularly, the present invention relates to a method of predicting battery life for providing additional services (e.g., financial services) through prediction of a residual value of a battery and an apparatus for performing the method.

2. DISCUSSION OF RELATED ART

Recently, with the rapid development of electric vehicle-related power electronics and battery technology, interest in the development and supply of electric vehicles that do not emit carbon dioxide is increasing worldwide.

However, there are still several obstacles to the expansion of the spread of electric vehicles. In particular, the energy density of a battery is not yet large enough, and thus it is not possible to satisfactorily increase the driving mileage of an electric vehicle. Therefore, many studies are being actively conducted to increase the charging capacity of a battery by increasing the energy density of the battery. Although batteries of electric vehicles are becoming more and more advanced through research, due to requirements for high safety and high performance of the batteries of the electric vehicles, when the chargeable capacity reaches a critical capacity (e.g., 80%) as compared to a new battery, the battery is regarded as a waste battery and is no longer used in the electric vehicle, and is subject to a disposal procedure.

Disposal of batteries can lead to environmental pollution caused by the chemical substances in the batteries. The disposal of batteries means that enormous resources are wasted nationally, and thus there is a need for sufficient discussion on the reuse of batteries. Further, the batteries discarded from the electric vehicles still have a value corresponding to a residual capacity of about 80%, and thus it is considered that when the batteries are applied to output stabilization of renewable energy, which is an application field that mainly operates at lower requirements than electric vehicles or a current rate (c-rate) of 1 or less, the use of late-night power, or the like, economic feasibility can be sufficiently secured.

Therefore, the value of the reuse of the batteries of the electric vehicles is increasing, and opportunities to generate new and diverse business models including a financial service based on a battery of an electric vehicle can be provided.

In order to reuse the batteries of the electric vehicles, it is important to determine the value of the batteries of the electric vehicles. The determination of the value of the battery of the electric vehicle may be performed by accurately measuring the capacity and performance of the battery through a battery diagnostic test. However, the battery diagnostic test of the electric vehicle only informs the degree of performance degradation at that moment and does not predict a trend for the performance degradation related to the expected lifetime, that is, the remaining useful lifetime, when reused. That is, this is because, even when the degree of performance degradation is equally calculated through the battery diagnostic test, when a usage environment or driving history until being discarded is different, the degradation tendency of the battery also varies during a secondary usage period. Therefore, in order to determine the value of the battery of the electric vehicle, it is necessary to determine not only the degree of performance degradation but also the history of use of the battery of the electric vehicle.

That is, a study on a method of accurately determining the value of a battery of an electric vehicle to provide a financial service based on the battery of the electric vehicle is required.

SUMMARY OF THE INVENTION

An object of the present invention is to solve all of the above problems.

In addition, the present invention is to accurately determine a residual value of an electric vehicle battery and enable battery trading based on the residual value of the battery.

Further, the present invention is to accurately determine a residual value of an electric vehicle battery by complexly considering physical/chemical battery test data and also vehicle data.

According to an aspect of the present invention, there is provided a method of predicting battery life, comprises collecting, by a battery information collection unit, battery information; generating. by a first battery valuation unit, first battery value data; generating. by a second battery valuation unit, second battery value data; and determining, by a battery valuation unit, a battery value based on the first battery value data and the second battery value data, wherein the first battery value data is a battery value determined based on a battery diagnostic test, and the second battery value data is a battery value determined based on vehicle data.

Meanwhile, wherein the generating of the first battery value data includes: determining, by a current capacity-based determination unit, a first state of health (SoH) by measuring capacity through a current integration method during charging and discharging of the battery; and determining, by an internal resistance-based determination unit, a second SoH based on an internal resistance of the battery; and generating, by the first battery valuation unit, the first battery value data by assigning different SoH weights to the first SoH and the second SoH, and the SoH weight is adjusted based on a first battery valuation result of the first battery valuation unit and a battery value feedback result for an actual battery value.

Further, wherein the second battery valuation unit generates the second battery value data based on a plurality of pieces of sub-vehicle data, the plurality of pieces of sub-vehicle data forms a plurality of data groups on a second battery valuation plane, and each of the plurality of data groups forms a plurality of clustering sets, the second battery value data is determined by determining only some of the plurality of clustering sets as valid cluster sets in consideration of a valuation result and a feedback result on an actual battery value, the plurality of clustering sets are determined based on sub-vehicle data weights assigned to each of the plurality of pieces of sub-vehicle data, and the sub-vehicle data weight is determined based on a second battery valuation result of the second battery valuation unit and the feedback result on the actual battery value.

According to another aspect of the present invention, there is provided an apparatus for determining a battery value for predicting battery life, the apparatus comprises a battery information collection unit configured to collect battery information; a first battery valuation unit configured to generate first battery value data; a second battery valuation unit configured to generate second battery value data; and a battery valuation unit configured to determine a battery value based on the first battery value data and the second battery value data, wherein the first battery value data is a battery value determined based on a battery diagnostic test, and the second battery value data is a battery value determined based on vehicle data.

Meanwhile, wherein a current capacity-based determination unit of the first battery valuation unit determines a first state of health (SoH) by measuring capacity through a current integration method during charging and discharging of the battery, an internal resistance-based determination unit of the first battery valuation unit determines a second SoH based on an internal resistance of the battery, the first battery valuation unit generates the first battery value data by assigning different SoH weights to the first SoH and the second SoH, and the SoH weight is adjusted based on a first battery valuation result of the first battery valuation unit and a battery value feedback result for an actual battery value.

Further, wherein the second battery valuation unit generates the second battery value data based on a plurality of pieces of sub-vehicle data, the plurality of pieces of sub-vehicle data forms a plurality of data groups on a second battery valuation plane, and each of the plurality of data groups forms a plurality of clustering sets, the second battery value data is determined by determining only some of the plurality of clustering sets as valid cluster sets in consideration of a valuation result and a feedback result on an actual battery value, the plurality of clustering sets are determined based on sub-vehicle data weights assigned to each of the plurality of pieces of sub-vehicle data, and the sub-vehicle data weight is determined based on a second battery valuation result of the second battery valuation unit and the feedback result on the actual battery value.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
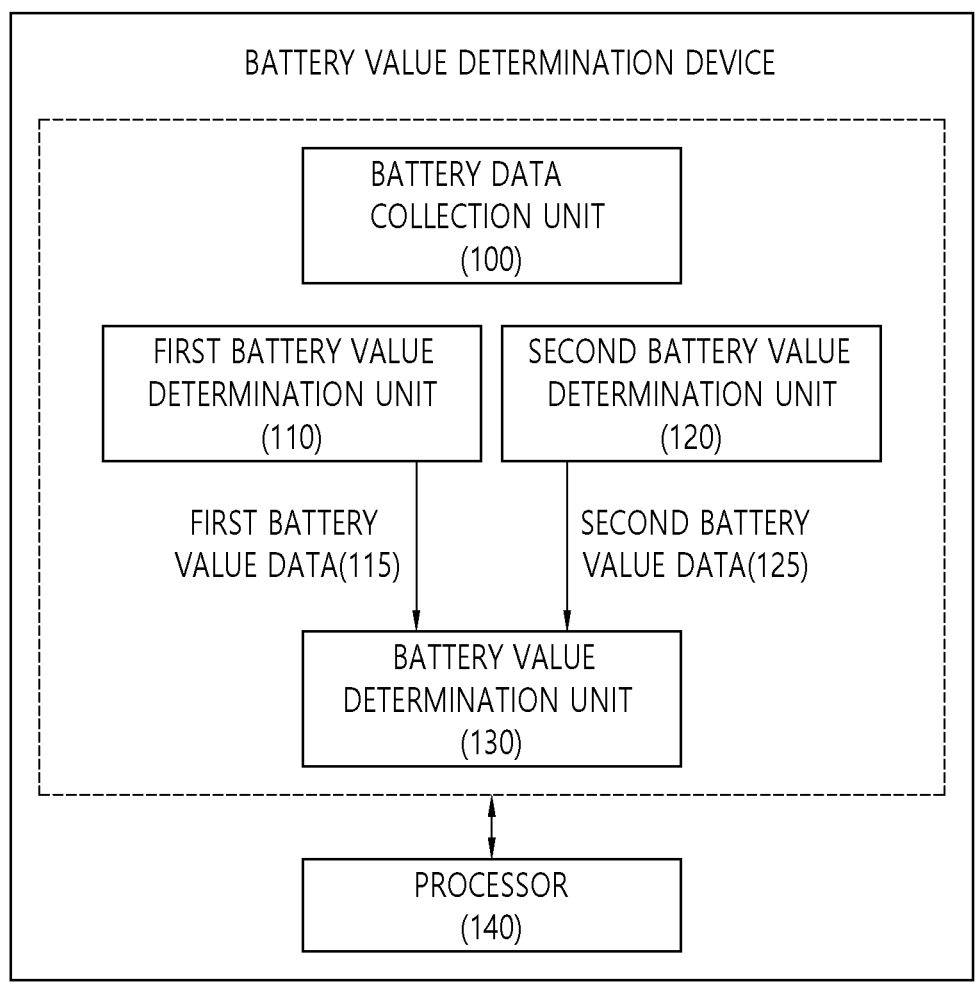
FIG. 1 is a conceptual diagram illustrating a battery value determination device according to an embodiment of the present invention.

The detailed description of the present invention will be made with reference to the accompanying drawings showing examples of specific embodiments of the present invention. These embodiments will be described in detail such that the present invention can be performed by those skilled in the art. It should be understood that various embodiments of the present invention are different but are not necessarily mutually exclusive. For example, a specific shape, structure, and characteristic of an embodiment described herein may be implemented in another embodiment without departing from the scope and spirit of the present invention. In addition, it should be understood that a position or arrangement of each component in each disclosed embodiment may be changed without departing from the scope and spirit of the present invention. Accordingly, there is no intent to limit the present invention to the detailed description to be described below. The scope of the present invention is defined by the appended claims and encompasses all equivalents that fall within the scope of the appended claims. Like reference numerals refer to the same or like elements throughout the description of the figures.

Hereinafter, in order to enable those skilled in the art to practice the present invention, exemplary embodiments of the present invention will be described in detail with reference to the accompanying drawings.

FIG. 1 is a conceptual diagram illustrating a battery value determination device according to an embodiment of the present invention.

In FIG. 1, a battery value determination device for determining a residual value of a battery is disclosed.

Referring to FIG. 1, the battery value determination device may include a battery data collection unit 100, a first battery value determination unit 110, a second battery value determination unit 120, a battery value determination unit 130, and a processor 140.

The battery data collection unit 100 may collect information on a battery, which is a subject of value determination. The battery information may include information that is a basis for determining the value of the battery, such as battery identification information, battery usage information, vehicle driving data, or the like.

The first battery value determination unit 110 may directly determine the value of the battery through a battery diagnostic test. For example, the first battery value determination unit 110 may perform determination of a state of health (SoH) of the battery, and the SoH may include information on a charge amount maintained as compared to an initial charge amount. The first battery value determination unit 110 may generate first battery value data 115 as a result of the value determination.

The second battery value determination unit 120 may determine the value of the battery on the basis of vehicle data. For example, the vehicle data is data about a vehicle driven using the corresponding battery, and may include vehicle identification data, charging history data (fast/slow charging of the battery, charge amount (full charge and over charge)), battery usage environment data, vehicle driving data (driving speed, driving mileage, etc.), or the like. The second battery value determination unit 120 may generate second battery value data 125 as a result of the value determination.

The battery value determination unit 130 may be implemented to finally determine the value of the battery on the basis of the first battery value data 115 and the second battery value data 125. The battery value determination unit 130 may synthesize the first battery value data 115 and the second battery value data 125 to finally determine the value of the battery. A specific method of determining, by the battery value determination unit, the value of the battery will be described below.

The processor 140 may be implemented to control the operations of the battery data collection unit 100, the first battery value determination unit 510, the second battery value determination unit 120, and the battery value determination unit 130.

Figure 2:
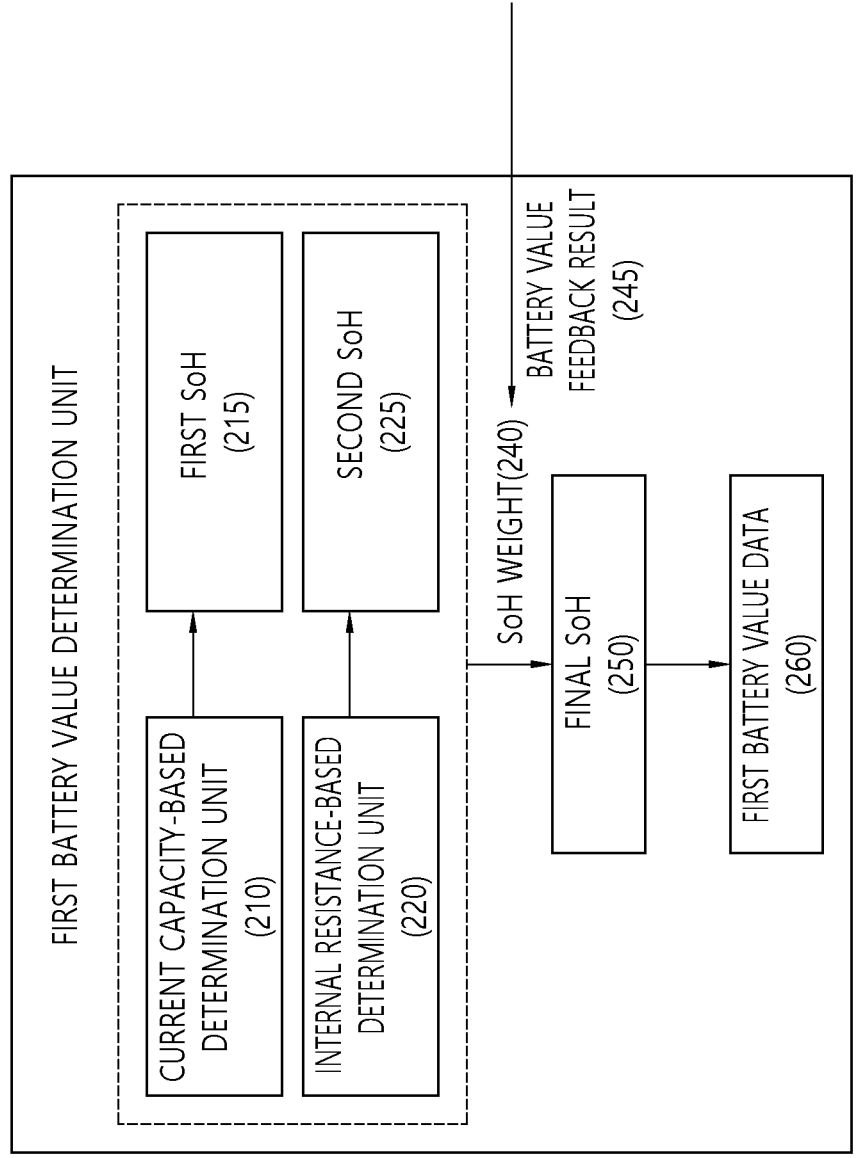
FIG. 2 is a conceptual diagram illustrating the operation of a first battery value determination unit according to an embodiment of the present invention.

FIG. 2 is a conceptual diagram illustrating the operation of a first battery value determination unit according to an embodiment of the present invention.

In FIG. 2, the operation of the first battery value determination unit is disclosed.

Referring to FIG. 2, the first battery value determination unit may determine a SoH of a battery through a battery diagnostic test to directly determine the value of the battery.

The first battery value determination unit may include a current capacity-based determination unit 210 and/or an internal resistance-based determination unit 220.

The current capacity-based determination unit 210 may determine the SoH of the battery using the current capacity and the internal parameters that change with a constant tendency during the aging of the battery. Since the capacity of the battery is reduced as the battery ages, the current capacity-based determination unit 210 may measure the capacity of the battery using a current integration method during charging and discharging to determine the SoH.

The internal resistance-based determination unit 220 may predict an internal resistance of the battery using the characteristics of a terminal current generated in the battery when the electric vehicle is driven to determine the SoH.

The internal resistance-based determination unit 220 may determine the SoH in consideration that an internal resistance $R_s$ of the battery proportionally increases based on a battery equivalent circuit model including a resistor-capacitor (RC) ladder as the charge/discharge number increases. The internal resistance $R_s$ is estimated using a relationship between a terminal current and a terminal voltage when a discharge current is rapidly generated. In this case, a change ($\Delta V$) of the terminal voltage is determined by the internal resistance $R_s$ contributing to an instantaneous voltage change, and a ladder voltage with a long time constant is negligible. In order to solve a current integration error and an error caused by the capacity changed during aging, a fully charged state in which the terminal voltage reaches a maximum allowable voltage of the battery may be determined as an $R_s$ estimation time.

A final SoH 250 may be determined based on a first SoH 215 determined by the current capacity-based determination unit 210 and a second SoH 225 determined by the internal resistance-based determination unit 220. The first battery value determination unit may determine first battery value data 260 based on the determined SoH.

The final SoH 250 may be determined by assigning different weights to each of the first SoH 215 and the second SoH 225.

Different SoH weights $w_x$ and $w_y$ 240 may be assigned to each of the first SoH 215 and the second SoH 225 according to a battery identifier and battery information (year of battery, battery usage environment (e.g., battery cooling environment)). In consideration of a first value determination result obtained by the first battery value determination unit and a battery value feedback result 245 for an actual battery value, the weights of the first and second SoHs 215 and 225 may be adaptively adjusted, and the final SoH 250 may be determined based on the adaptively adjusted first and second SoHs 215 and 225.

Figure 3:
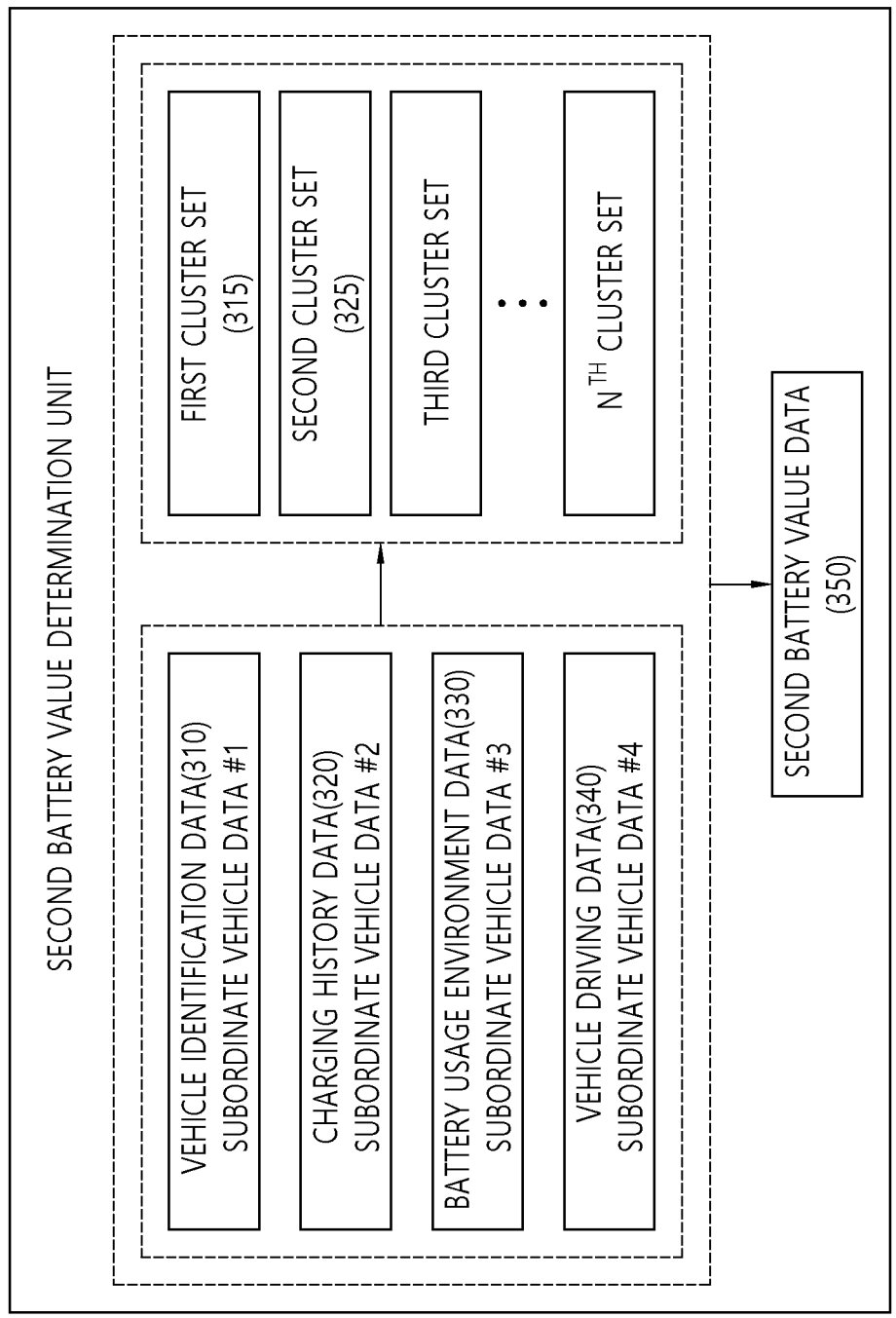
FIG. 3 is a conceptual diagram illustrating the operation of a second battery value determination unit according to an embodiment of the present invention.

FIG. 3 is a conceptual diagram illustrating the operation of a second battery value determination unit according to an embodiment of the present invention.

In FIG. 3, a method of generating, by the second battery value determination unit, second battery value data based on vehicle data is disclosed.

Referring to FIG. 3, the second battery value determination unit may perform determination of the value of a battery on the basis of vehicle identification data 310, charging history data 320, battery usage environment data 330, vehicle driving data 340, or the like to generate second battery value data 350.

The vehicle identification data 310 is data for identifying a vehicle in which the battery is installed. The vehicle identification data 310 may include information on a type of a vehicle, a vehicle model name, a vehicle production year, or the like.

The charging history data 320 is a charging history for the battery, and may include data on whether fast or slow charging is performed, the number of times of charging, the charging amount during charging, or the like.

The battery usage environment data 330 is data about a usage environment in which the battery is used, and may include information on an environment (air-cooled type, water-cooled type, etc.) in which the battery is cooled, information on a temperature at which the battery is used, or the like.

The vehicle driving data 340 is data regarding the driving of the vehicle, and may include information on a vehicle driving mileage, a vehicle driving speed, the number of times of rapid start/rapid acceleration, or the like.

The vehicle identification data 310, the charging history data 320, the battery usage environment data 330, and the vehicle driving data 340 are examples used for generating, by the second battery value determination unit, the second battery value data 350, and other various pieces of data may be used.

The vehicle identification data 310, the charging history data 320, the battery usage environment data 330, and the vehicle driving data 340 may be expressed as four subordinate vehicle data coordinate values (a, b, c, and d), respectively. The vehicle identification data 310 may be expressed as subordinate vehicle data #1, the charging history data 320 may be expressed as subordinate vehicle data #2, the battery usage environment data 330 may be expressed as subordinate vehicle data $3, and the vehicle driving data 340 may be expressed as subordinate vehicle data #4.

Each of the vehicle identification data 310, the charging history data 320, the battery usage environment data 330, and the vehicle driving data 340 may be expressed as a single numerical value in consideration of the similarity of data.

The vehicle identification data 310 may be quantified in consideration of the similarity of the vehicle. For example, the similarity of the vehicle may be determined in consideration of the determination of each of the similarity of a model of a vehicle and the similarity of a vehicle production year.

The charging history data 320 may be quantified in consideration of the similarity of the charging history. The similarities of data indicating whether fast or slow charging is performed, data indicating the number of times of charging, and data indicating the charging amount during charging, which are the subordinate data included in the charging history data 320, may each be quantified and then synthesized to determine the similarity of the charging hi story.

The battery usage environment data 330 may be quantified in consideration of the similarity of the usage environment of the battery. The similarity of the cooling environment of the battery and the similarity of the temperature at which the battery is used may each be quantified and then synthesized to determine the similarity of the usage environment of the battery.

The vehicle driving data 340 may be quantified in consideration of the similarity of the vehicle driving. The similarity of the driving mileage of the vehicle, the similarity of the driving speed of the vehicle and the similarity of the number of times of rapid start/rapid acceleration may each be quantified and then synthesized to determine the similarity of the vehicle driving.

Vehicle identification data, charging history data, battery usage environment data, and vehicle driving data of each of a plurality of vehicles may be expressed as four subordinate vehicle data coordinate values (a, b, c, and d) serving as subordinate vehicle data on a four-dimensional second battery value determination plane.

The plurality of vehicle data coordinate values may be clustered to form a first cluster set (including a first cluster #1 to a first cluster #n) 315.

In the present invention, the four subordinate vehicle data coordinate values may be grouped to form different clusters. For example, the vehicle identification data 310 and the charging history data 320 may form one subordinate vehicle data group #1, and the charging history data 330 and the battery usage environment data 340 may form one subordinate vehicle data group #2.

The subordinate vehicle data group #1 and the subordinate vehicle data group #2 may be expressed as vehicle data coordinate values (a, b) on a two-dimensional second battery value determination plane in consideration of the similarity in the same manner. The vehicle data coordinate values corresponding to the subordinate vehicle data group #1 and the subordinate vehicle data group #2 may be clustered to form a second cluster set (including a second cluster #1 to a second cluster #n) 325.

In this way, the first cluster set 315 to an $n^{th}$ cluster set may be formed based on a combination of various pieces of the subordinate vehicle data, and the first cluster set 315 to the $n^{th}$ cluster set may be used to generate the second battery value data 350 by determining only some clusters among the first cluster set to the $n^{th}$ cluster set as valid cluster sets in consideration of a value determination result and a feedback result for an actual battery value.

Figure 4:
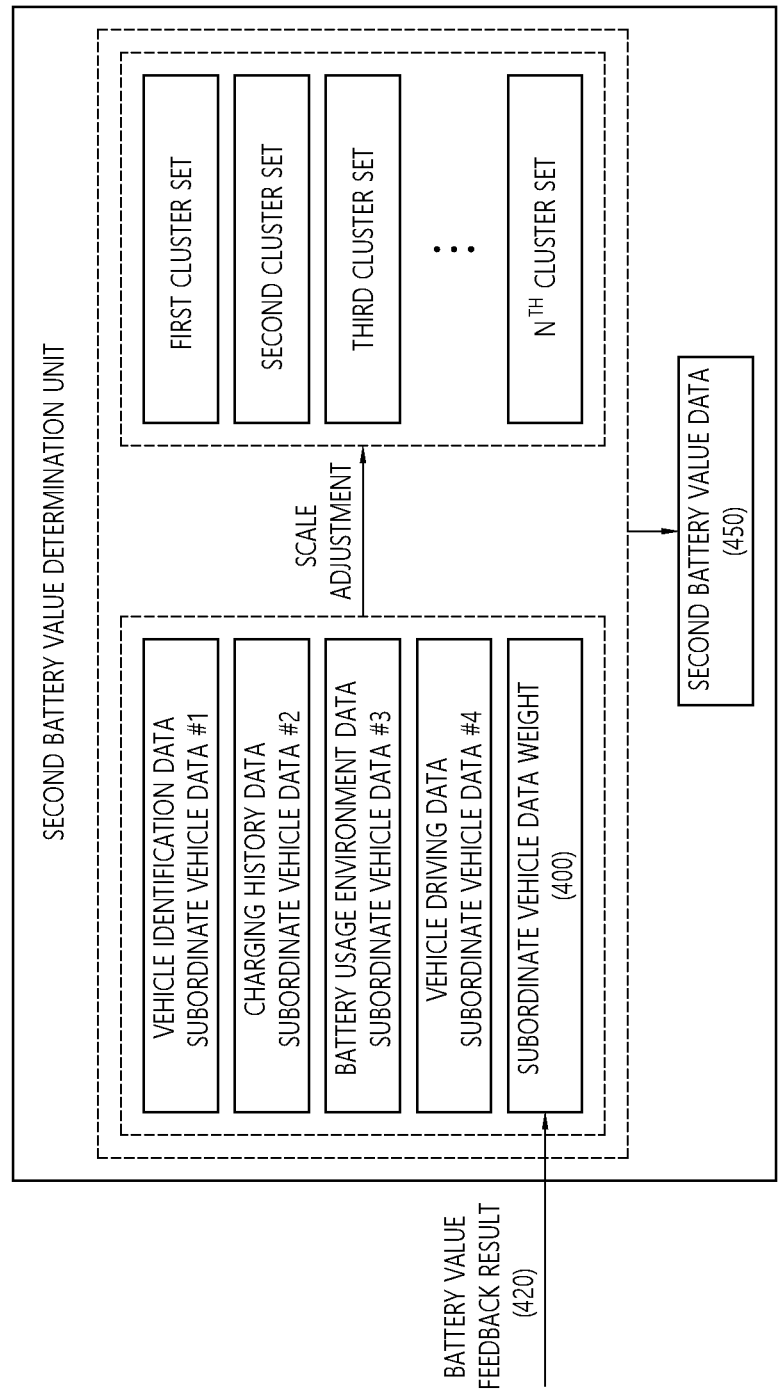
FIG. 4 is a conceptual diagram illustrating the operation of a second battery value determination unit according to an embodiment of the present invention.

FIG. 4 is a conceptual diagram illustrating the operation of a second battery value determination unit according to an embodiment of the present invention.

In FIG. 4, a method of generating, by the second battery value determination unit, second battery value data by adaptively adjusting vehicle data based on feedback data is disclosed.

Referring to FIG. 4, a weight for each of vehicle identification data, charging history data, battery usage environment data, and vehicle driving data, which are subordinate vehicle data, may be adjusted.

For more accurate prediction, weights $w_1$, $w_2$, $w_3$, and $w_4$ respectively serving as weights for the vehicle identification data, the charging history data, the battery usage environment data, and the vehicle driving data may be adjusted based on a second value determination result obtained by the second battery value determination unit and a feedback result for an actual battery value. The weights $w_1$, $w_2$, $w_3$, and $w_4$ may be called "subordinate vehicle data weights 480."

First, cluster-based prediction may be performed based on the same weight, and the set values of the weights $w_1$, $w_2$, $w_3$, and $w_4$ in which an error between the value determination result and the actual battery value is minimized may be determined based on the feedback result.

A scale of a coordinate axis on the second battery value determination plane may be changed according to the values of the weights $w_1$, $w_2$, $w_3$, and $w_4$. The scale of the coordinate axis on the second battery value determination plane may be adjusted so that the higher the weight, the closer to each other.

Such scale adjustment may be performed in units of the above-described cluster sets (the first cluster set to the $n^{th}$ cluster set).

The value determination result and a battery value feedback result 820 for the actual battery value may be obtained through continuous checking of the use of the battery, and as data on the use of the battery is accumulated, the weights $w_1$, $w_2$, $w_3$, and $w_4$ may be optimally set to generate more accurate second battery value data 850.

Figure 5:
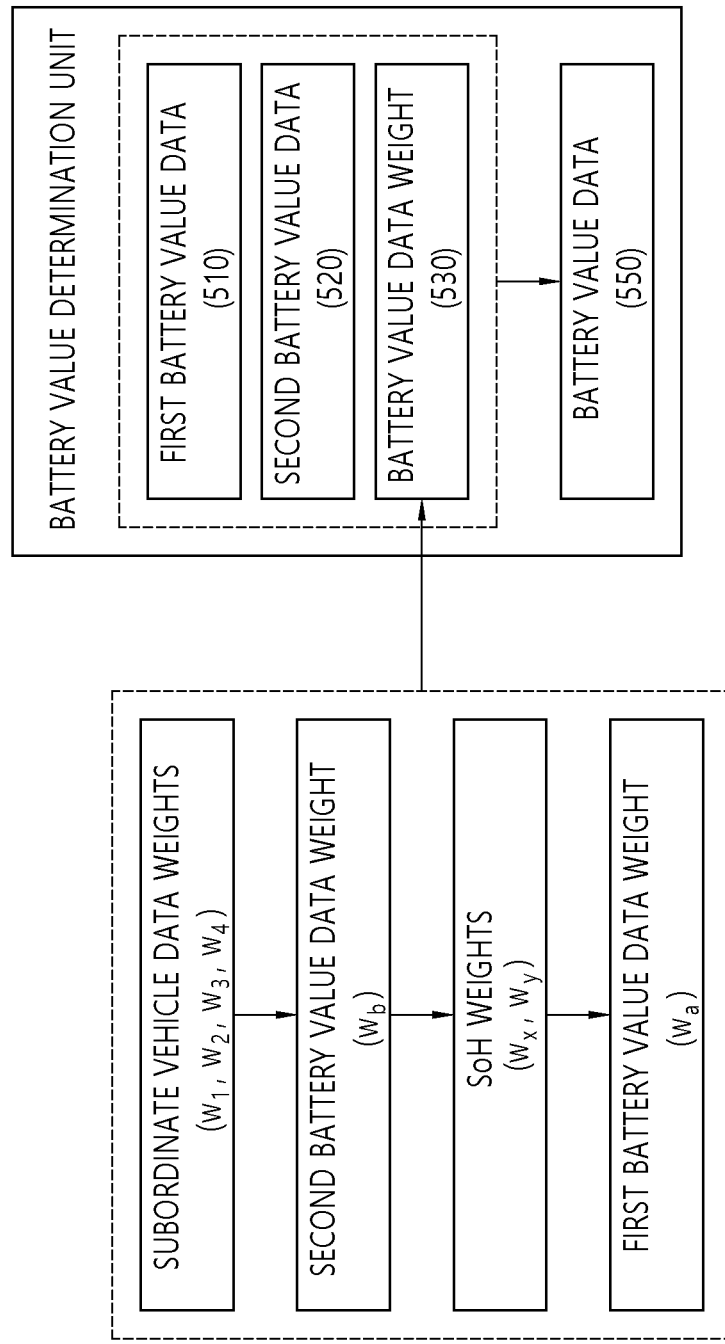
FIG. 5 is a conceptual diagram illustrating the operation of a battery value determination unit according to an embodiment of the present invention.

FIG. 5 is a conceptual diagram illustrating the operation of a battery value determination unit according to an embodiment of the present invention.

In FIG. 5, a method of finally determining, by the battery value determination unit, the value of the battery on the basis of the determination result of each of the first battery value determination unit and the second battery value determination unit is disclosed.

Referring to FIG. 5, the first battery value determination unit may determine first battery value data 510, and the second battery value determination unit may determine second battery value data 520.

The battery value determination unit may determine battery value data on the basis of the first battery value data 510 and the second battery value data 520.

The battery value data may be determined based on the first battery value data 510 and the second battery value data 520, and may be determined by applying the weights $w_a$ and $w_b$ to the first battery value data 510 and the second battery value data 520, respectively.

The weights $w_a$ and $w_b$ may be called "battery value data weights 530."

The battery value data weights 530 may be determined in consideration of the value determination result and the feedback result for the actual battery value.

The battery value determination unit according to the embodiment of the present invention may adjust the weights in the following order.

1) Adjustment of weights $w_1$, $w_2$, $w_3$, and $w_4$ of the subordinate vehicle data
2) Adjustment of a weight $w_b$ of the second battery value data
3) Adjustment of weights $w_x$ and $w_y$ of a SoH
4) Adjustment of a weight $w_a$ of the first battery value data 1) and 2) may be weight adjustments based on data, and 3) and 4) may be weight adjustments based on physical and/or chemical principles. The weight adjustments based on data may have a relatively large change range, and the weight adjustments based on physical and/or chemical principles may have a relatively small change range.

Therefore, by first performing the weight adjustments based on the data and then performing the weight adjustments based on the physical and/or chemical principles, more accurate battery value data may be determined.

The embodiments of the present invention described above may be implemented in the form of program instructions that can be executed through various computer units and recorded on computer readable media. The computer readable media may include program instructions, data files, data structures, or combinations thereof. The program instructions recorded on the computer readable media may be specially designed and prepared for the embodiments of the present invention or may be available instructions well known to those skilled in the field of computer software. Examples of the computer readable media include magnetic media such as a hard disk, a floppy disk, and a magnetic tape, optical media such as a compact disc read only memory (CD-ROM) and a digital video disc (DVD), magneto-optical media such as a floptical disk, and a hardware device, such as a ROM, a RAM, or a flash memory, that is specially made to store and execute the program instructions. Examples of the program instruction include machine code generated by a compiler and high-level language code that can be executed in a computer using an interpreter and the like. The hardware device may be configured as at least one software module in order to perform operations of embodiments of the present invention and vice versa.

While the present invention has been described with reference to specific details such as detailed components, specific embodiments and drawings, these are only examples to facilitate overall understanding of the present invention and the present invention is not limited thereto. It will be understood by those skilled in the art that various modifications and alterations may be made.

Therefore, the spirit and scope of the present invention are defined not by the detailed description of the present invention but by the appended claims, and encompass all modifications and equivalents that fall within the scope of the appended claims.

What is claimed is:

1. A method of predicting battery life, comprising:
   collecting, by a battery information collection unit, battery information;
   generating, by a first battery valuation unit, first battery value data;
   generating, by a second battery valuation unit, second battery value data; and
   determining, by a battery valuation unit, a battery value based on the first battery value data and the second battery value data,
   wherein the first battery value data is a battery value determined based on a battery diagnostic test, and
   the second battery value data is a battery value determined based on vehicle data, and
   wherein the generating of the first battery value data includes:
   determining, by a current capacity-based determination unit, a first state of health (SoH) by measuring capacity through a current integration method during charging and discharging of a battery; and
   determining, by an internal resistance-based determination unit, a second SoH based on an internal resistance of the battery, the internal resistance of the battery being estimated using the characteristics of a terminal current generated in the battery when an electric vehicle is driven;
   solving a current integration error and an error caused by the capacity changed during aging based on a determination of an internal resistance estimation time; and
   generating, by the first battery valuation unit, the first battery value data by assigning different SoH weights to the first SoH and the second SoH,
   wherein the SoH weight is adjusted based on a first battery valuation result of the first battery valuation unit and a battery value feedback result for an actual battery value.

2. The method of claim 1, wherein the second battery valuation unit generates the second battery value data based on a plurality of pieces of sub-vehicle data,
   the plurality of pieces of sub-vehicle data forms a plurality of data groups on a second battery valuation plane, and each of the plurality of data groups forms a plurality of clustering sets,
   the second battery value data is determined by determining only some of the plurality of clustering sets as valid cluster sets in consideration of a valuation result and a feedback result on an actual battery value,
   the plurality of clustering sets are determined based on sub-vehicle data weights assigned to each of the plurality of pieces of sub-vehicle data, and
   the sub-vehicle data weight is determined based on a second battery valuation result of the second battery valuation unit and the feedback result on the actual battery value.

3. The method of claim 2, wherein vehicle identification data, charging history data, battery usage environment data and/or vehicle driving data are expressed as four subordinate vehicle data coordinate values.

4. The method of claim 1, wherein the internal resistance is estimated using a relationship between a terminal current and a terminal voltage when a discharge current is rapidly generated.

5. The method of claim 4, wherein a fully charged state in which the terminal voltage reaches a maximum allowable voltage of the battery is determined as the internal resistance estimation time.

6. The method of claim 1, further comprising:
   determining, by the second battery value determination unit, the battery value on the basis of vehicle identification data, charging history data, battery usage environment data, or vehicle driving data to generate the second battery value data.

7. The method of claim 6, wherein the charging history data includes data on whether fast or slow charging is performed, a number of times of charging, or a charging amount during the charging.

* * * * *